United States Patent
Nishimoto

(10) Patent No.: US 8,030,940 B2
(45) Date of Patent: Oct. 4, 2011

(54) BATTERY VOLTAGE MEASURING SYSTEM

(75) Inventor: Masashi Nishimoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 700 days.

(21) Appl. No.: 12/007,219

(22) Filed: Jan. 8, 2008

(65) Prior Publication Data

US 2008/0169820 A1 Jul. 17, 2008

(30) Foreign Application Priority Data

Jan. 12, 2007 (JP) ................................. 2007-004274

(51) Int. Cl.
G01N 27/416 (2006.01)
(52) U.S. Cl. ........................................ 324/433; 324/426
(58) Field of Classification Search .................... 324/433
See application file for complete search history.

(56) References Cited

U.S. PATENT DOCUMENTS

| | | | | |
|---|---|---|---|---|
| 4,243,975 | A | * | 1/1981 | Masuda et al. ................. 341/168 |
| 5,032,825 | A | * | 7/1991 | Kuznicki ................. 340/636.15 |
| 5,698,971 | A | | 12/1997 | Sahai et al. |
| 6,462,510 | B1 | | 10/2002 | Takada et al. |
| 6,639,408 | B2 | * | 10/2003 | Yudahira et al. ............... 324/434 |
| 6,646,442 | B2 | | 11/2003 | Katoh |
| 6,737,850 | B2 | | 5/2004 | Kushiyama |
| 7,158,068 | B2 | * | 1/2007 | Kobayashi et al. ........... 341/155 |
| 2006/0244423 | A1 | * | 11/2006 | Henningson ................... 320/150 |

FOREIGN PATENT DOCUMENTS

| | | |
|---|---|---|
| JP | 4-208719 (A) | 7/1992 |
| JP | 4-291820 | 10/1992 |
| JP | 5-047871 | 6/1993 |
| JP | 9-49868 (A) | 2/1997 |
| JP | 2000-13227 (A) | 1/2000 |
| JP | 2000-88898 (A) | 3/2000 |
| JP | 2001-352245 (A) | 12/2001 |
| JP | 2002-84191 (A) | 3/2002 |
| JP | 2002-221544 (A) | 8/2002 |
| JP | 2002-325371 (A) | 11/2002 |

* cited by examiner

Primary Examiner — M'Baye Diao
(74) Attorney, Agent, or Firm — Foley & Lardner LLP

(57) ABSTRACT

A battery voltage measuring system includes an analog/digital converter configured to receive a higher reference voltage and a lower reference voltage which is lower than the higher reference voltage and to outputs a digital output value based on an input voltage which is lower than the high voltage reference voltage and is higher than the low voltage reference voltage. A battery supplies a battery voltage as the higher reference voltage to the analog/digital converter; a first power supply supplies a first reference voltage as the input voltage to the analog/digital converter; and a second power supply supplies a second reference voltage as the lower reference voltage to the analog/digital converter.

19 Claims, 17 Drawing Sheets

BATTERY VOLTAGE MEASURING SYSTEM

BACKGROUND OF THE INVENTION

1. Field of the Invention

The present invention relates to a battery voltage measuring system for measuring voltage of a battery mounted in a portable device. This Patent Application is based on Japanese Patent Application No. 2007-004274. The disclosure of the Japanese Patent Application is incorporated herein by reference.

2. Description of Related Art

Portable devices driven by cells or batteries have been known. The portable devices are such as a notebook-sized PC (Personal Computer), a mobile phone, a PDA (Personal Digital Assistant), a digital camera, a digital video (digital video camera) and a portable audio device. In recent years, capabilities of the portable devices have been dramatically improved by accompanying downsizing and advancement of semiconductor devices built therein. In conjunction with this, a control of voltage of the battery built in the portable device (battery voltage) has become important to operate the portable devices stably. The precise battery voltage needs to drive the portable device with the battery for a long time. For this reason, a battery voltage measuring system for precisely measuring the battery voltage is demanded.

Hereinafter, a conventional battery voltage measuring systems will be described. Japanese Laid Open Utility Model Application (JU-A-Heisei 5-47871) describes a battery voltage detecting circuit as a first conventional example. Japanese Laid Open Patent Application (JP-A-Heisei 4-291820) describes an A/D conversion circuit for battery voltage detection as a second conventional example.

FIG. 1 shows a configuration of the battery voltage detecting circuit 110 of the first conventional example. The battery voltage detecting circuit 110 has a power source 101, a battery 105 and an analog/digital (A/D) converter 106. The A/D converter 106 has a reference top terminal to which a higher reference voltage $V_{RT}$ is supplied, a reference bottom terminal to which a lower reference voltage VRB which is lower than the higher reference voltage $V_{RT}$ is supplied, an input terminal to which an analog input voltage $V_{IN}$ between the higher reference voltage $V_{RT}$ and the lower reference voltage $V_{RB}$ is supplied, and output terminals. The reference bottom terminal (VRB) is grounded. In other words, the lower reference voltage $V_{RB}$ is 0[V]. The A/D converter 106 generates a digital output value $D_{out1}$ as a result of comparison of a difference between a value of the input voltage $V_{IN}$ and the lower reference voltage $V_{RB}$ and a difference between a value of the higher reference voltage $V_{RT}$ and the lower reference voltage $V_{RB}$ and outputs the digital output value $D_{out1}$ through the output terminals thereof.

An anode of the battery 105 is connected to the reference top terminal ($V_{RT}$) of the A/D converter 106, and a cathode of the battery 105 is grounded. Thus, a battery voltage $V_{bat}$ is supplied from the battery 105 to the reference top terminal of the A/D converter 106 as the higher reference voltage VRT. An anode of the power source 101 is connected to the analog input terminal ($V_{IN}$) of the A/D converter 106, and the cathode of the power source 101 is grounded. Thus, a reference voltage $V_{ref1}$ is supplied to the input terminal $V_{IN}$ of the A/D converter 106 as the input voltage $V_{IN}$. The A/D converter 106 generates the digital output value $D_{out1}$ as a result of comparison between a value of the battery voltage $V_{bat}$ and the reference voltage $V_{ref1}$ and outputs the digital output value $D_{out1}$. In this manner, the battery voltage detecting circuit 110 in the first conventional example detects the battery voltage $V_{bat}$ by the digital output value $D_{out1}$ outputted from the A/D converter 106. A measurement range is limited to the state $V_{bat} \geq V_{ref1}$.

FIG. 2 shows a relationship between the battery voltage $V_{bat}$ and the digital output value $D_{out1}$ in the battery voltage detecting circuit 110 of the first conventional example. Provided that resolution of the A/D converter 106 is of n bits, the digital output value $D_{out1}$ of the A/D converter 106 in the battery voltage detecting circuit 110 is obtained according to the following equation (1).

$$D_{out1} = \frac{V_{ref1}}{\frac{V_{bat} - 0}{2^n - 1}} = (2^n - 1)\frac{V_{ref1}}{V_{bat}} \qquad (1)$$

Here, the resolution is n and the reference voltage $V_{ref1}$ are both constant, and the equation (1) becomes a linear fractional function having only the battery voltage $V_{bat}$ as a variable. As shown in the equation (1), when the battery 105 discharges electricity (the portable device is driven by the battery 105), the digital output value $D_{out1}$ of the A/D converter 106 increases as the battery voltage $V_{bat}$ decreases. As shown in the equation (1) and FIG. 2, as battery voltage $V_{bat}$ decreases, an increase amount in digital output value $D_{out1}$ to a decrease amount in the battery voltage $V_{bat}$ is larger.

FIG. 3 shows a configuration of the battery voltage detecting circuit 120 according to a second conventional example. The battery voltage detecting circuit 120 has power sources 102 and 103, the battery 105, the A/D converter 106 and a voltage divider 107.

The A/D converter 106 has the reference top terminal $V_{RT}$ to which the higher reference voltage $V_{RT}$ is supplied, the reference bottom terminal $V_{RB}$ to which the lower reference voltage $V_{RB}$ lower than the higher reference voltage $V_{RT}$ is supplied, the analog input terminal $V_{IN}$ to which the input voltage $V_{IN}$ between the higher reference voltage $V_{RT}$ and the lower reference voltage $V_{RB}$ is supplied, and the output terminals. The A/D converter 106 generates a digital output value $D_{out2}$ as a result of comparison of a difference between the input voltage $V_{IN}$ and the lower reference voltage $V_{RB}$ ($V_{ref3}$) and a difference between the higher reference voltage $V_{RT}$ ($V_{ref2}$) and the lower reference voltage $V_{RB}$ ($V_{ref3}$) and outputs the digital output value $D_{out2}$ from the output terminals.

The voltage divider 107 has an input terminal, an output terminal and a ground terminal. The anode of the battery 105 is connected to the input terminal of the voltage divider 107, and the cathode thereof is grounded. Thus, the battery voltage $V_{bat}$ is supplied to the voltage divider 107. The output terminal of the voltage divider 107 is connected to the analog input terminal ($V_{IN}$) of the A/D converter 106. The voltage divider 107 generates a divided battery voltage $xV_{bat}$ obtained by dividing the battery voltage $V_{bat}$ in a voltage division ratio x (0<x≦1) and supplies the divided battery voltage $xV_{bat}$ as the input voltage $V_{IN}$ to the A/D converter 106. The anode of the power source 102 is connected to the reference top terminal ($V_{RT}$) of the A/D converter 106, and the cathode thereof is grounded. Thus, a reference voltage $V_{ref2}$ as the higher reference voltage $V_{RT}$ is supplied to the A/D converter 106. The anode of the power source 103 is connected to the reference bottom terminal ($V_{RB}$) of the A/D converter 106, and the cathode thereof is grounded. Thus, a reference voltage $V_{ref3}$ as the lower reference voltage $V_{RB}$ is supplied to the A/D converter 106. In this case, the A/D converter 106 generates the digital output value $D_{out2}$ based on the divided battery voltage $xV_{bat}$ as a result of comparison of a difference between the divided battery voltage $xV_{bat}$ and the reference voltage $V_{ref3}$ and a difference between the reference voltage $V_{ref2}$ and the reference voltage $V_{ref3}$ and outputs the digital output value $D_{out2}$.

In this manner, the battery voltage detecting circuit 120 according to the second conventional example detects the battery voltage $V_{bat}$ from the digital output value $D_{out2}$ outputted from the A/D converter 106. The detection range is limited to a range of $V_{ref3} \leq xV_{bat} \leq V_{ref2}$ or $V_{ref3}/x \leq V_{bat} \leq V_{ref2}/x$.

FIG. 4 shows a relation of the battery voltage $V_{bat}$ and the digital output value $D_{out2}$ in the battery voltage detecting circuit 120 according to the second conventional example. Provided that resolution of the A/D converter 106 is of n bits, the digital output value $D_{out2}$ of the A/D converter 106 in the battery voltage detecting circuit 120 is obtained according to the following equation (2).

$$D_{out2} = \frac{xV_{bat} - V_{ref3}}{\frac{V_{ref2} - V_{ref3}}{2^n - 1}} = (2^n - 1)\frac{xV_{bat} - V_{ref3}}{V_{ref2} - V_{ref3}} \quad (2)$$

Here, the resolution n, the reference voltages $V_{ref2}$ and $V_{ref3}$ and the voltage division ratio x are constants, and the equation (2) becomes a linear fractional function having only the battery voltage $V_{bat}$ as a variable. As shown in the equation (2), when the battery 105 discharges electricity (the portable device is driven by the battery 105), the digital output value $D_{out2}$ of the A/D converter 106 decreases as the battery voltage $V_{bat}$ decreases. As shown in the equation (2) and FIG. 4, a decrease amount in the digital output value $D_{out2}$ to a decrease amount in the battery voltage $V_{bat}$ becomes constant (linear fractional function).

As described above, to stably operate the portable device, it is important to control the battery voltage. Especially, in detection of the battery voltage, a voltage at the time when the battery has been used for long time so that it cannot discharge electricity (discharge end voltage) needs to be acquired. For this reason, it is desired to measure the battery voltage near the discharge end voltage with high accuracy.

However, to measure the battery voltage near the discharge end voltage, the battery voltage detecting circuit 110 according to the first conventional example requires an A/D converter having a high resolution. In this case, scale of circuit becomes large, resulting in an increase in power consumption.

In the battery voltage detecting circuit 120 according to the second conventional example, when the voltage division ratio x is made smaller to measure the battery voltage near the discharge end voltage with high accuracy, the measurement range of the battery voltage $V_{bat}$ becomes larger. That is, as x in $V_{ref3}/x \leq V_{bat} \leq V_{ref2}/x$ is smaller, $V_{ref3}/x$ and $V_{ref2}/x$ become larger. Furthermore, as measurement accuracy is made higher, the measurement range becomes smaller. Moreover, the battery voltage detecting circuit 120 requires the voltage divider 107 in addition to the A/D converter 106.

Further improvement is demanded in the battery voltage detecting circuits 110 and 120.

SUMMARY

In a first aspect of the present invention, a battery voltage measuring system includes an analog/digital converter configured to receive a higher reference voltage and a lower reference voltage which is lower than the higher reference voltage and to outputs a digital output value based on an input voltage which is lower than the higher reference voltage and is higher than the lower reference voltage; a battery configured to supply a battery voltage as the higher reference voltage to the analog/digital converter; a first power supply configured to supply a first reference voltage as the input voltage to the analog/digital converter; and a second power supply configured to supply a second reference voltage as the lower reference voltage to the analog/digital converter.

In a second aspect of the present invention, a method of measuring a battery voltage is achieved by supplying a battery voltage to an analog/digital converter as a higher reference voltage; by supplying a first reference voltage to the analog/digital converter as an input voltage; by supply a second reference voltage to the analog/digital converter as a lower reference voltage; and by converting the input voltage which is lower than the higher reference voltage and is higher than the lower reference voltage into a digital output value by the analog/digital converter.

In a third aspect of the present invention, a voltage monitor circuit includes first and second terminals between which a voltage to be monitored is supplied; and an A/D converter having an input node and first and second reference nodes and performing an A/D converting operation on a voltage supplied to the input node in response to a voltage between the first and second reference nodes. The first reference node is connected to the first terminal, the input node is supplied with a first reference voltage which is generated with respect to the second terminal. The second reference node is supplied with a second reference voltage which is different from a voltage supplied to the second terminal.

In the present invention, by setting a value of the voltage between the terminals to be a small value, the battery voltage near the discharge end voltage can be measured with high accuracy.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE PREFERRED EMBODIMENTS

Hereinafter, a battery voltage measuring system according to embodiments of the present invention will be described in detail with reference to the attached figures.

Figure 1:
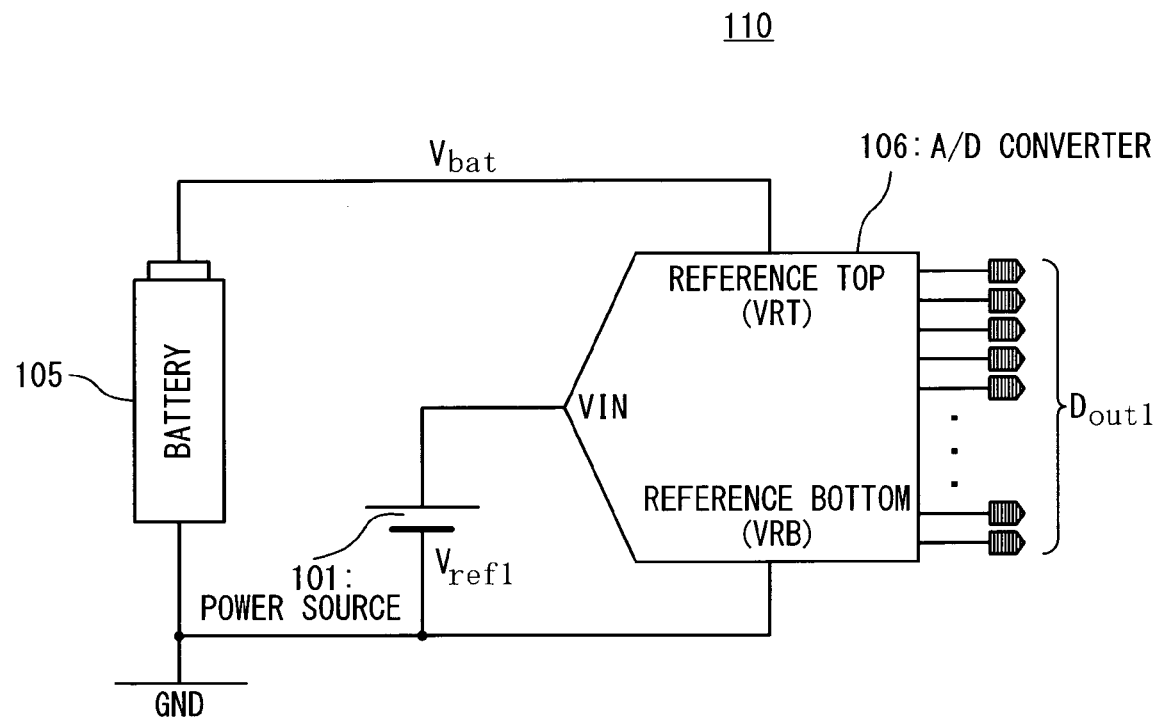
FIG. 1 shows a configuration of a battery voltage detecting circuit 110 according to a first conventional example.
Figure 2:
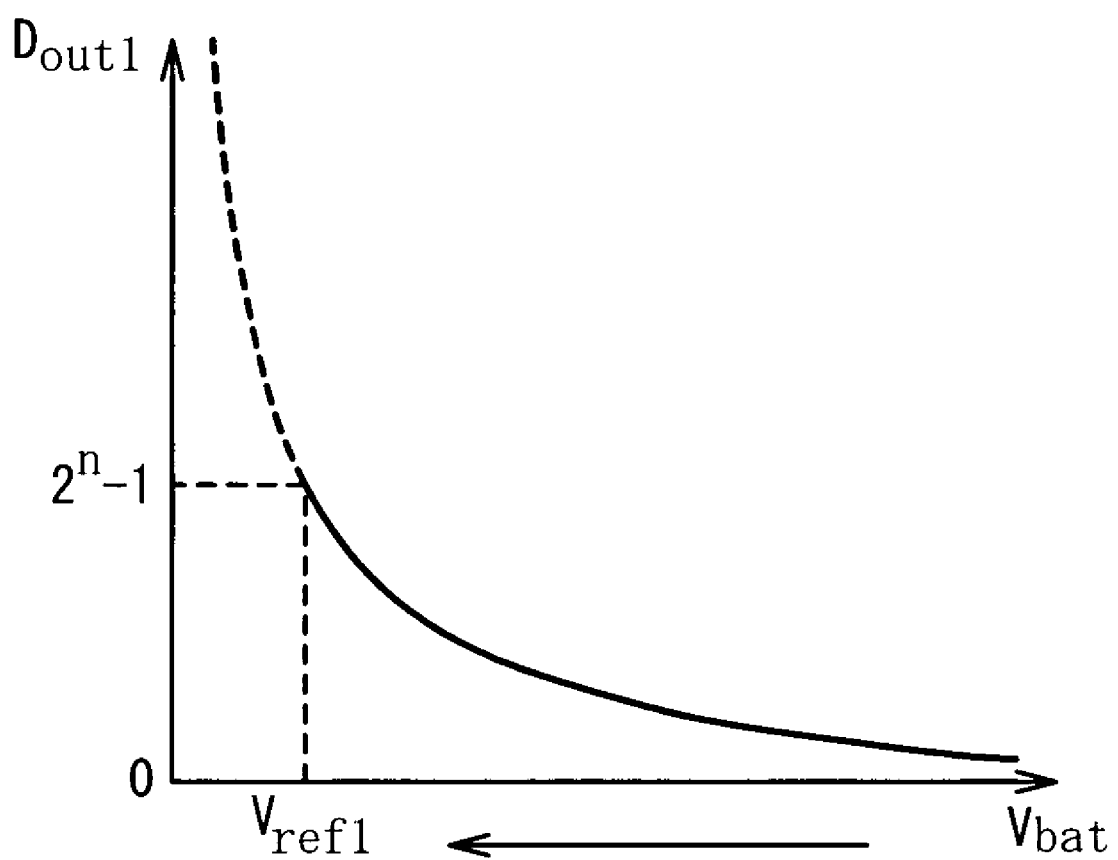
FIG. 2 shows a relationship between a battery voltage $V_{bat}$ and a digital output value $D_{out1}$ in the battery voltage detecting circuit 110 according to the first conventional example.
Figure 3:
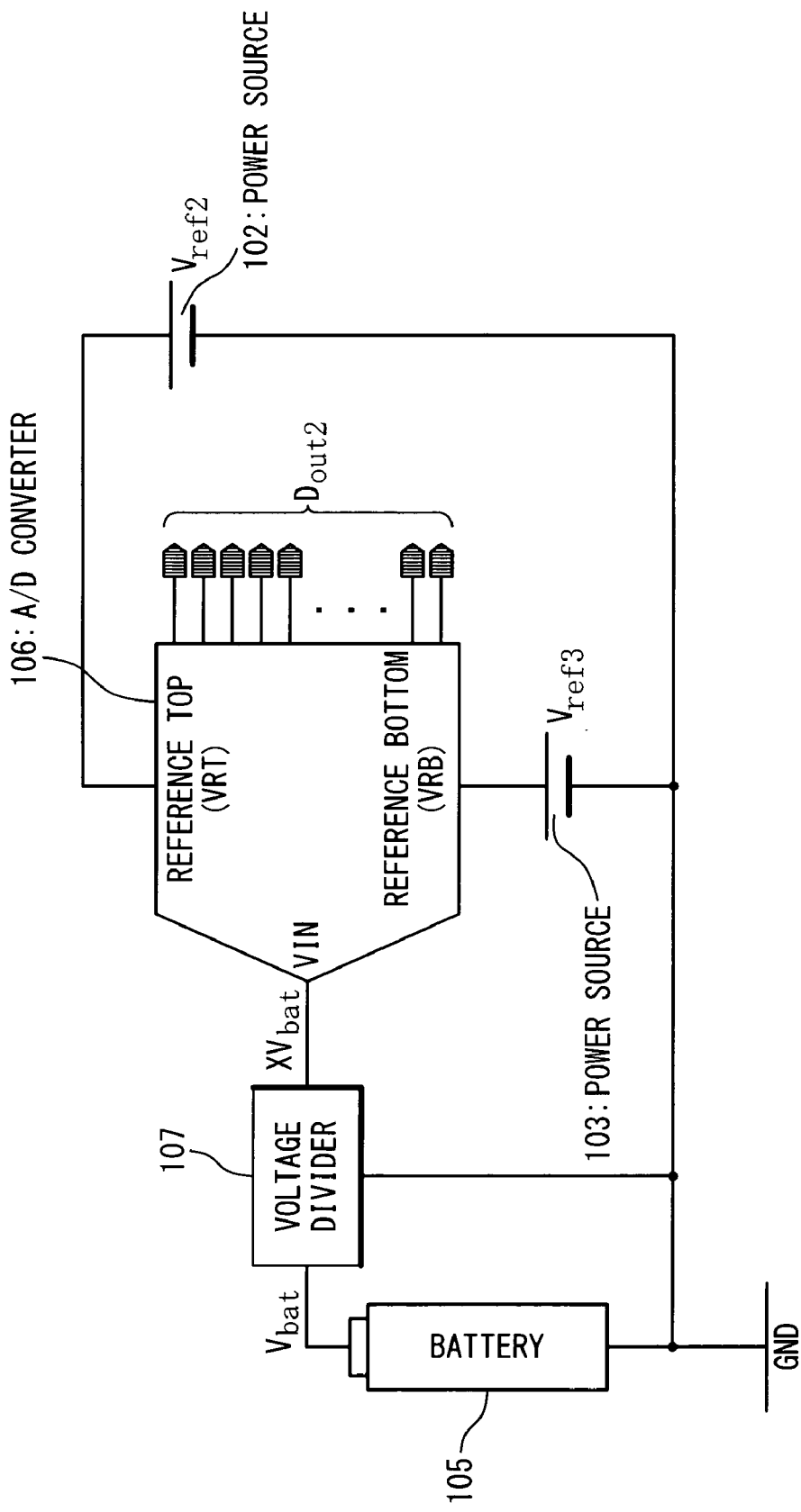
FIG. 3 shows a configuration of a battery voltage detecting circuit 120 according to a second conventional example.
Figure 4:
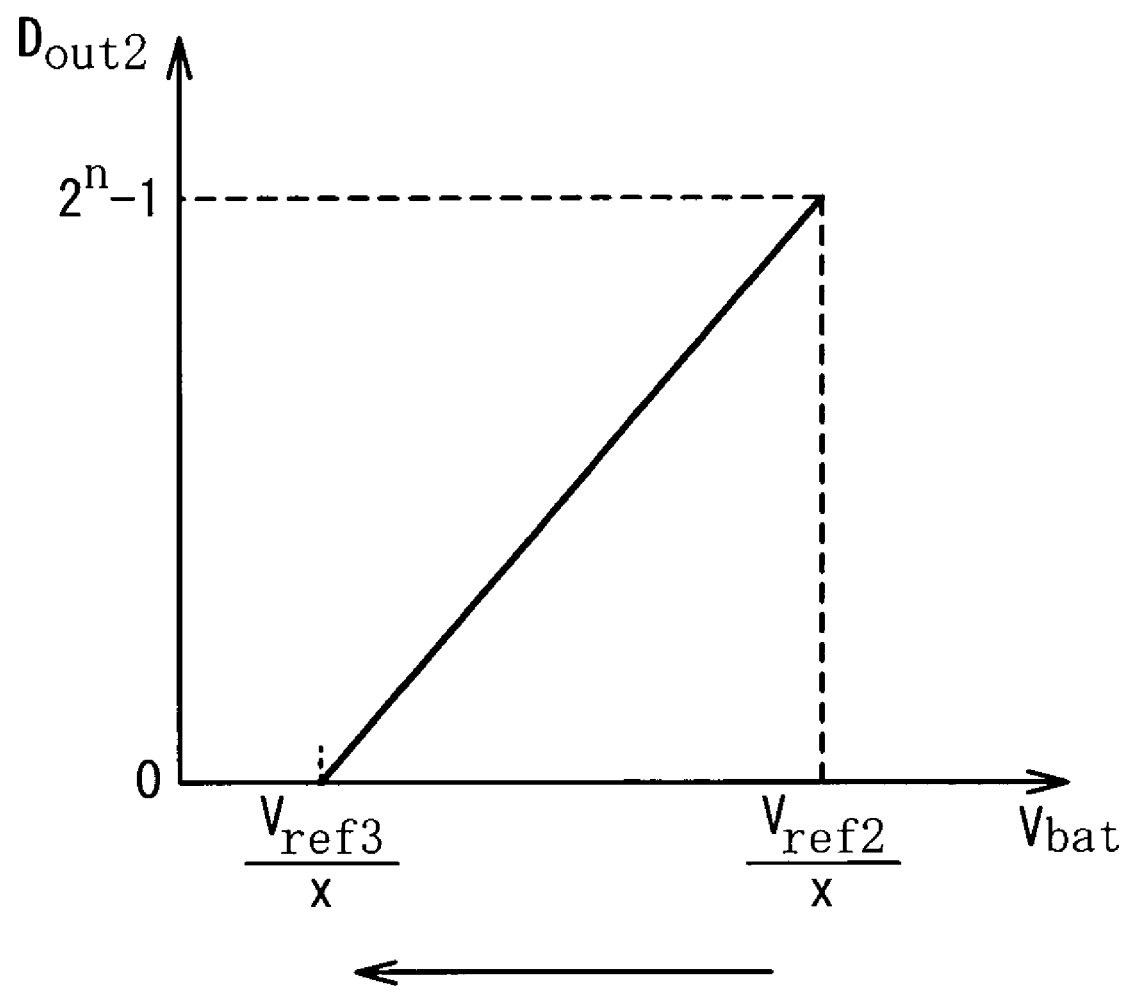
FIG. 4 shows a relationship between a battery voltage $V_{bat}$ and a digital output value $D_{out2}$ in the battery voltage detecting circuit 120 according to the second conventional example.
Figure 5:
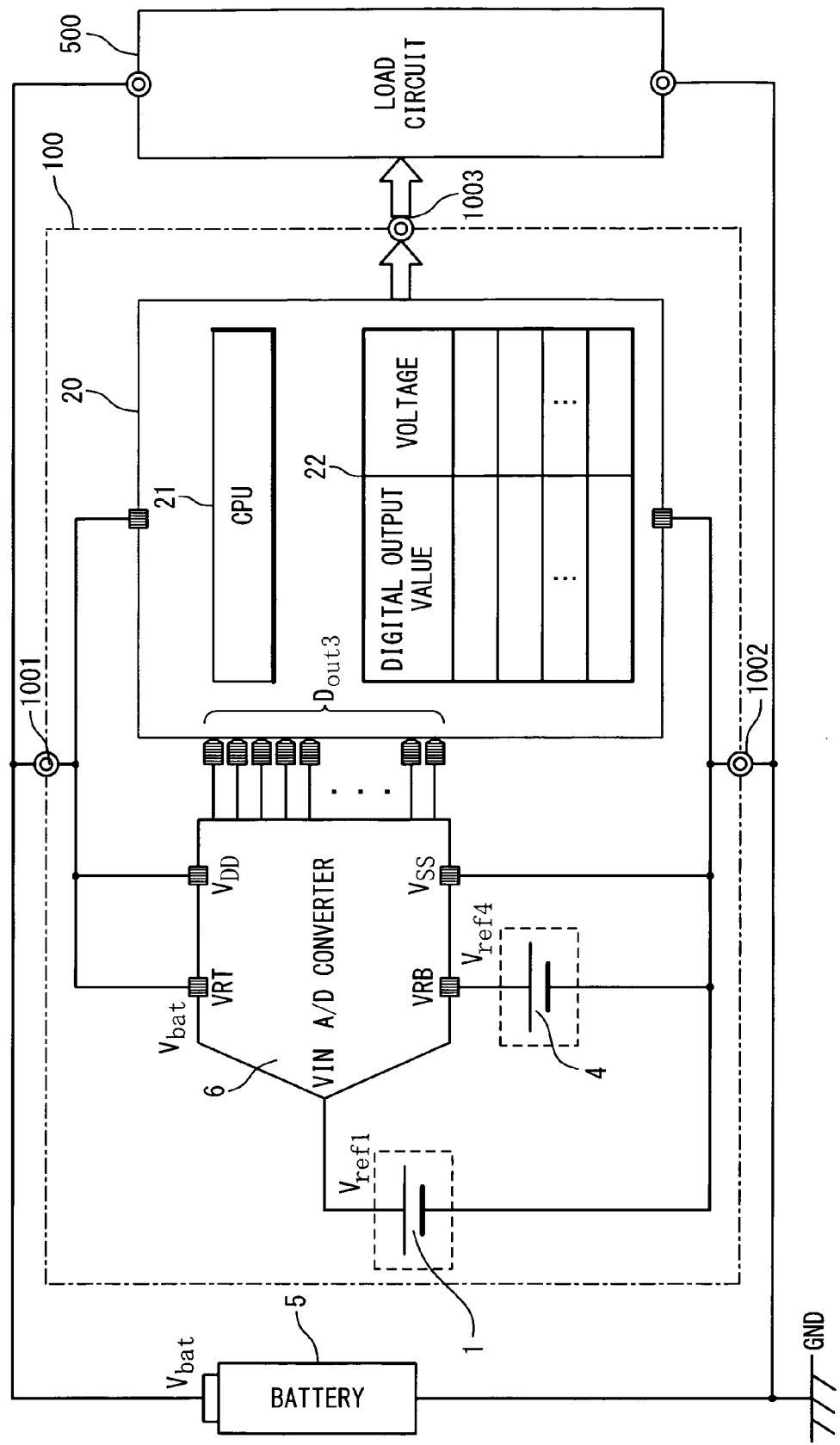
FIG. 5 shows a configuration of a battery voltage measuring system 10 according to the present invention.

FIG. 5 shows a configuration of the battery voltage measuring system 10 according to the embodiments of the present invention. The battery voltage measuring system 10 is composed of a battery 5, and a battery voltage measuring circuit 100. The battery 5 is connected to a load circuit 500. The battery voltage measuring circuit 100 is realized as an integrated circuit (IC) in this example but may be realized by individual circuits. The battery voltage measuring circuit 100 has reference voltage sources 1 and 4, an analog/digital (A/D) converter 6 and a control unit 20.

The battery voltage measuring circuit 100 according to a first embodiment of the present invention is separated from a mobile device in which the battery 5 is installed. The battery voltage measuring circuit 100 according to a second embodiment of the present invention may be installed in the mobile device itself together with the battery 5. Also, a mobile device test system according to a third embodiment of the present invention includes the battery voltage measuring circuit 100 composed of the reference voltage sources 1 and 4 and the A/D converter 6, and the battery 5, which are installed in the mobile device, and the control unit 20. The load circuit 500 may be installed inside the mobile device and may be installed outside the mobile device.

The battery voltage measuring circuit 100 has a first power source terminal 1001 (a first terminal), a second power source terminal 1002 (a second terminal), and a signal output terminal 1003. A plus terminal of the battery 5 as a voltage measuring target is connected with the first power source terminal 1001, together with a power source terminal of the load circuit 500. The load circuit 500 and the battery voltage measuring circuit 100 may be formed as a single integrated circuit. The negative terminal of the battery 5 is grounded and is connected to the second power source terminal 1002, and a ground terminal of the load circuit 500.

The battery voltage measuring circuit 100 includes the A/D converter 6, which has a first power source node $V_{DD}$ (a first power node) connected to the first power source terminal 1001, a second power source node $V_{ss}$ (a second power node) connected to the second power source terminal 1002, a higher reference voltage node $V_{RT}$ (a first reference node), a lower reference voltage node $V_{RB}$ (a second reference node), and an input voltage node $V_{IN}$ (an input node). The higher reference voltage node $V_{RT}$ is connected to the first power source terminal 1001 and the lower reference voltage node $V_{RB}$ is connected to the second power source terminal 1002 through the reference voltage source 4. The reference voltage source 1 as a first reference voltage source is connected between the input voltage node $V_{IN}$ and the second power source terminal 1002, and the reference voltage source 4 as a second reference voltage source is connected between the lower reference voltage node $V_{RB}$ and the second power source terminal 1002.

The reference voltage source 1 operates on the voltage between the power source terminals 1001 and 1002 to generate a reference voltage $V_{ref1}$ which is supplied to the input voltage node $V_{IN}$. The reference voltage source 4 operates on the voltage between the power source terminals 1001 and 1002 to generate a reference voltage $V_{ref4}$ which is supplied to the lower reference voltage node $V_{RB}$. The reference voltage $V_{ref4}$ is lower than the reference voltage $V_{ref1}$. These reference voltages $V_{ref1}$ and $V_{ref4}$ may be generated in the outside of the battery voltage measuring circuit 100 instead of generated in the inside of the battery voltage measuring circuit 100.

Thus, the A/D converter 6 operates based on the power source voltage between power source nodes $V_{DD}$ and $V_{SS}$ and performs the A/D conversion on a signal voltage supplied to the input voltage node $V_{IN}$ by using the voltages applied to the higher reference voltage node $V_{RT}$ and the lower reference voltage node $V_{RB}$. A digital output data $D_{out3}$ as the A/D conversion result is obtained from the comparison of a voltage between the voltage at the input voltage node $V_{IN}$ and the voltage at the lower reference voltage node $V_{RB}$ with the voltage between the voltage at the higher reference voltage node $V_{RT}$ and the voltage at the lower reference voltage node $V_{RB}$. The digital output data is supplied to the load circuit 500 through the signal output terminal 1003.

The control unit 20 has a CPU (Central Processing Unit) 21 and a table 22 indicating a relation of each of a plurality of digital output values and a voltage. Referring to the table 22, the CPU 21 detects one of a plurality of voltages based on the digital output value $D_{out3}$ outputted from the A/D converter 6 as the battery voltage $V_{bat}$. In this manner, the battery voltage measuring system 10 according to the first to third embodiments of the present invention can detect the battery voltage $V_{bat}$ on the basis of the digital output value $D_{out3}$ outputted from the A/D converter 6. However, the measurement range is limited to the state of $V_{bat} \geq V_{ref1} > V_{ref4}$.

Figure 6:
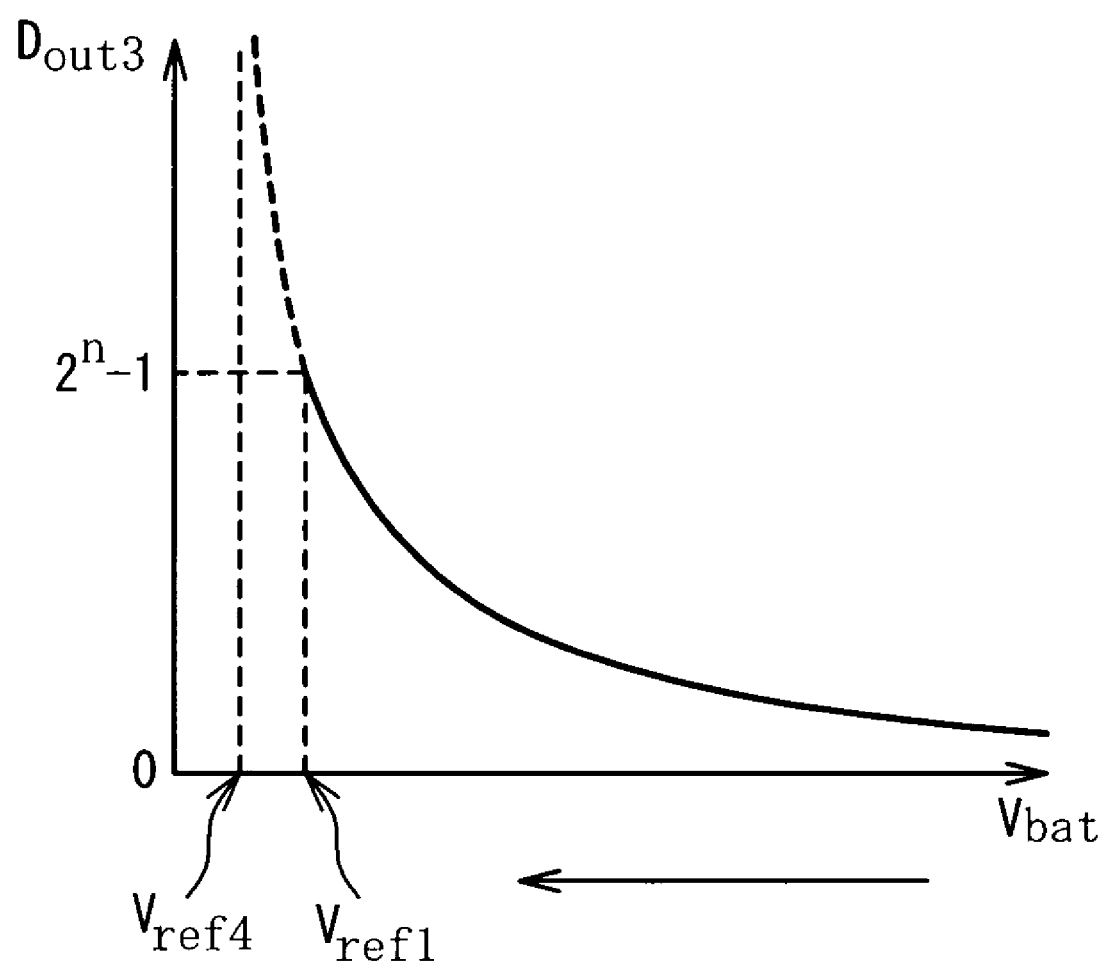
FIG. 6 shows a relationship between a battery voltage $V_{bat}$ and a digital output value $D_{out3}$ in the battery voltage measuring system 10 according to the present invention.

FIG. 6 shows a relationship of the battery voltage $V_{bat}$ and the digital output value $D_{out3}$ in the battery voltage measuring system 10 according to the first to third embodiments of the present invention. Provided that resolution of the A/D converter 6 is of n bits, the digital output value $D_{out3}$ of the A/D converter 6 in the battery voltage measuring system 10 is obtained according to the following equation (3).

$$D_{out3} = \frac{V_{ref1} - V_{ref4}}{\frac{V_{bat} - V_{ref4}}{2^n - 1}} = (2^n - 1)\frac{V_{ref1} - V_{ref4}}{V_{bat} - V_{ref4}} \quad (3)$$

Here, the resolution n and the reference voltages $V_{ref1}$ and $V_{ref4}$ are constants, and the equation (3) becomes a linear fractional function having only the battery voltage $V_{bat}$ as a variable. As shown in the equation (3), when the battery 5 discharges electricity (the portable device is driven by the battery 5), the digital output value $D_{out3}$ of the A/D converter 106 increases as the battery voltage $V_{bat}$ decreases. As shown in the equation (3) and FIG. 6, an increase amount in the digital output value $D_{out3}$ to a decrease amount in the battery voltage $V_{bat}$ becomes larger as the battery voltage $V_{bat}$ is decreased.

In the battery voltage measuring system 10 according to the first to third embodiments of the present invention, the battery 5 supplies the battery voltage $V_{bat}$ as the higher reference voltage $V_{RT}$ to the A/D converter 6, the power source 1 supplies the reference voltage $V_{ref1}$ as the input voltage $V_{IN}$ to the A/D converter 6 and the power source 4 supplies the reference voltage $V_{ref4}$ as the lower reference voltage $V_{RB}$ to the A/D converter 6. Therefore, the voltage between the reference top terminal ($V_{RT}$) and the reference bottom terminal ($V_{RB}$) of the A/D converter 6 can be changed to any voltage. For this reason, by setting a value of the voltage between the terminals to a small value, the battery voltage near the discharge end voltage can be measured with high accuracy.

Figure 7A:
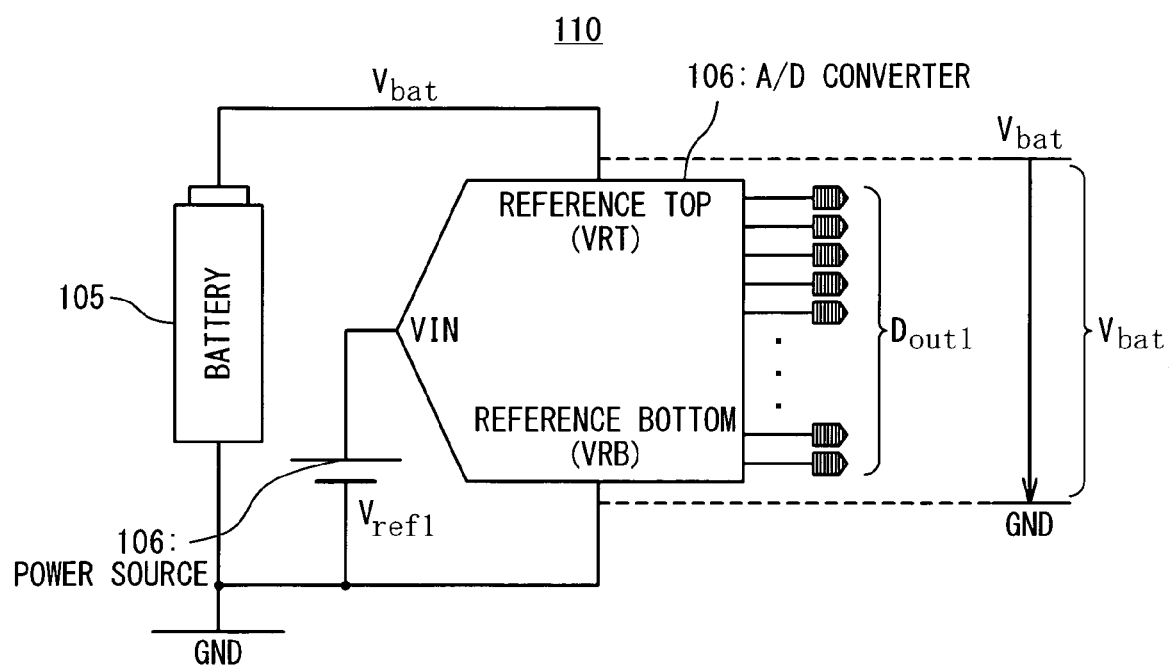
FIG. 7A shows a voltage between a reference top terminal (VRT) and a reference bottom terminal (VRB) of an A/D converter 106 in the battery voltage detecting circuit 110 according to the first conventional example.
Figure 7B:
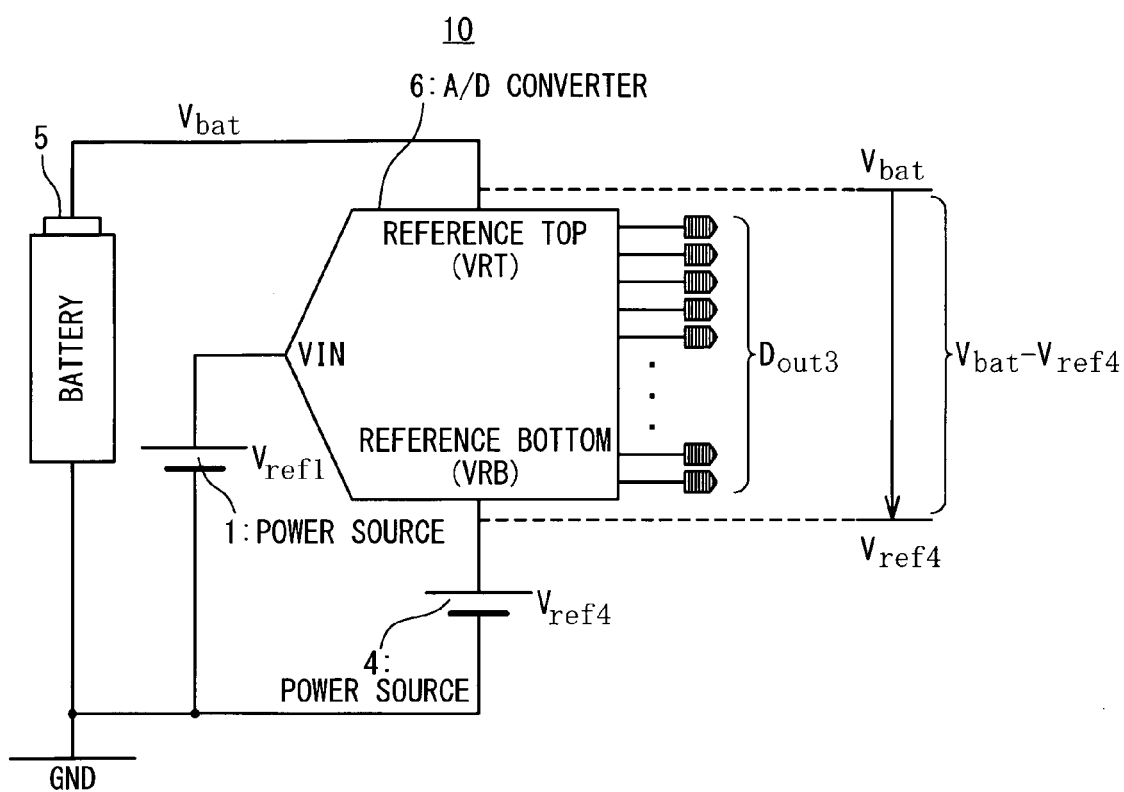
FIG. 7B shows a voltage between a reference top terminal (VRT) and a reference bottom terminal (VRB) of an A/D converter 106 in the battery voltage measuring system 10 according to the present invention.

Next, the above-mentioned effect will be described. In the battery voltage detecting circuit 110 according to the first conventional example, as shown in FIG. 7A, the voltage between the reference top terminal ($V_{RT}$) and the reference bottom terminal ($V_{RB}$) in the A/D converter 106 is $V_{bat}$. On the contrary, in the battery voltage measuring system 10 according to the present invention, as shown in FIG. 7B, since the reference voltage $V_{ref4}$ is supplied to the reference bottom terminal ($V_{RB}$), the voltage between the reference top terminal ($V_{RT}$) and the reference bottom terminal ($V_{RB}$) in the A/D converter 106 is $V_{bat}-V_{ref4}$. Thus, in the battery voltage measuring system 10 according to the present invention, measurement in any range can be performed by setting the reference voltage $V_{ref4}$ to be any value. In this manner, for example, when the battery voltage near the discharge end voltage is to be measured with high accuracy, the battery voltage measuring system 10 according to the present invention can perform measurement with higher accuracy than the battery voltage detecting circuit 110 according to the first conventional example, by setting the reference voltage $V_{ref4}$ to be a small value near the discharge end voltage. This will be described below.

To compare measurement accuracy in the first conventional example with that in the present invention, the equation (1) and the equation (3) are each differentiated. Derivatives of the digital output values $D_{out1}$ and $D_{out3}$ represent magnitude of variance in the digital output values $D_{out1}$ and $D_{out3}$, respectively. In other words, when absolute values of these values are larger, sensitivity to the input voltage VIN is higher, that is, accuracy is higher.

The absolute values when the equations (1) and (3) are differentiated are represented by the following equations (4) and (5).

$$|(D_{out1})'| = \left| -(2^n - 1)\frac{V_{ref1}}{(V_{bat})^2} \right| = (2^n - 1)\frac{V_{ref1}}{(V_{bat})^2} \quad (4)$$

$$|(D_{out3})'| = \left| -(2^n - 1)\frac{V_{ref1} - V_{ref4}}{(V_{bat} - V_{ref4})^2} \right|$$
$$= (2^n - 1)\frac{V_{ref1} - V_{ref4}}{(V_{bat} - V_{ref4})^2} \quad (5)$$

To compare the equation (4) with the equation (5), subtraction of the equation (4) from the equation (5) is represented by the following equation (6).

$$|(D_{out3})'| - |(D_{out1})'| = (2^n - 1)\frac{V_{ref1} - V_{ref4}}{(V_{bat} - V_{ref4})^2} - (2^n - 1)\frac{V_{ref1}}{(V_{bat})^2} \quad (6)$$
$$= (2^n - 1)\left\{ \frac{V_{ref1} - V_{ref4}}{(V_{bat} - V_{ref4})^2} - \frac{V_{ref1}}{(V_{bat})^2} \right\} \geq 0$$

When a condition shown by the following equation (7) is applied, the equation (6) is expanded to the following equations (8) to (11).

$$(2^n - 1)\left\{ \frac{V_{ref1} - V_{ref4}}{(V_{bat} - V_{ref4})^2} - \frac{V_{ref1}}{(V_{bat})^2} \right\} \geq 0 \quad (7)$$

$$\frac{V_{ref1} - V_{ref4}}{(V_{bat} - V_{ref4})^2} \geq \frac{V_{ref1}}{(V_{bat})^2} \quad (8)$$

$$(V_{ref1} - V_{ref4})(V_{bat})^2 - V_{ref1}(V_{bat} - V_{ref4})^2 \geq 0 \quad (9)$$

$$V_{ref1}(V_{bat})^2 - V_{ref4}(V_{bat})^2 - V_{ref1}\{(V_{bat})^2 - 2V_{bat}V_{ref4} + (V_{ref4})^2\} \geq 0 \quad (10)$$

$$-V_{ref4} \times \{(V_{bat})^2 - 2 \times V_{bat} \times V_{ref1} + V_{ref1} \times V_{ref4}\} \geq 0 \quad (11)$$

Here, because of $V_{ref4} \geq 0$, the equation (11) is represented by the following equation (12) and the equation (12) is expanded to the following equation (13).

$$(V_{bat})^2 - 2V_{bat}V_{ref1} + V_{ref1}V_{ref4} \geq 0 \quad (12)$$

$$V_{ref1} - \sqrt{(V_{ref1})^2 - V_{ref1}V_{ref4}} \leq \quad (13)$$
$$V_{bat} \leq V_{ref1} + \sqrt{(V_{ref1})^2 - V_{ref1}V_{ref4}}$$

Because of $V_{bat} \geq V_{ref1}$, the equation (13) is expanded to the following equation (14).

$$V_{ref1} \leq V_{bat} \leq V_{ref1} + \sqrt{(V_{ref1})^2 - V_{ref1}V_{ref4}} \quad (14)$$

Figure 8:
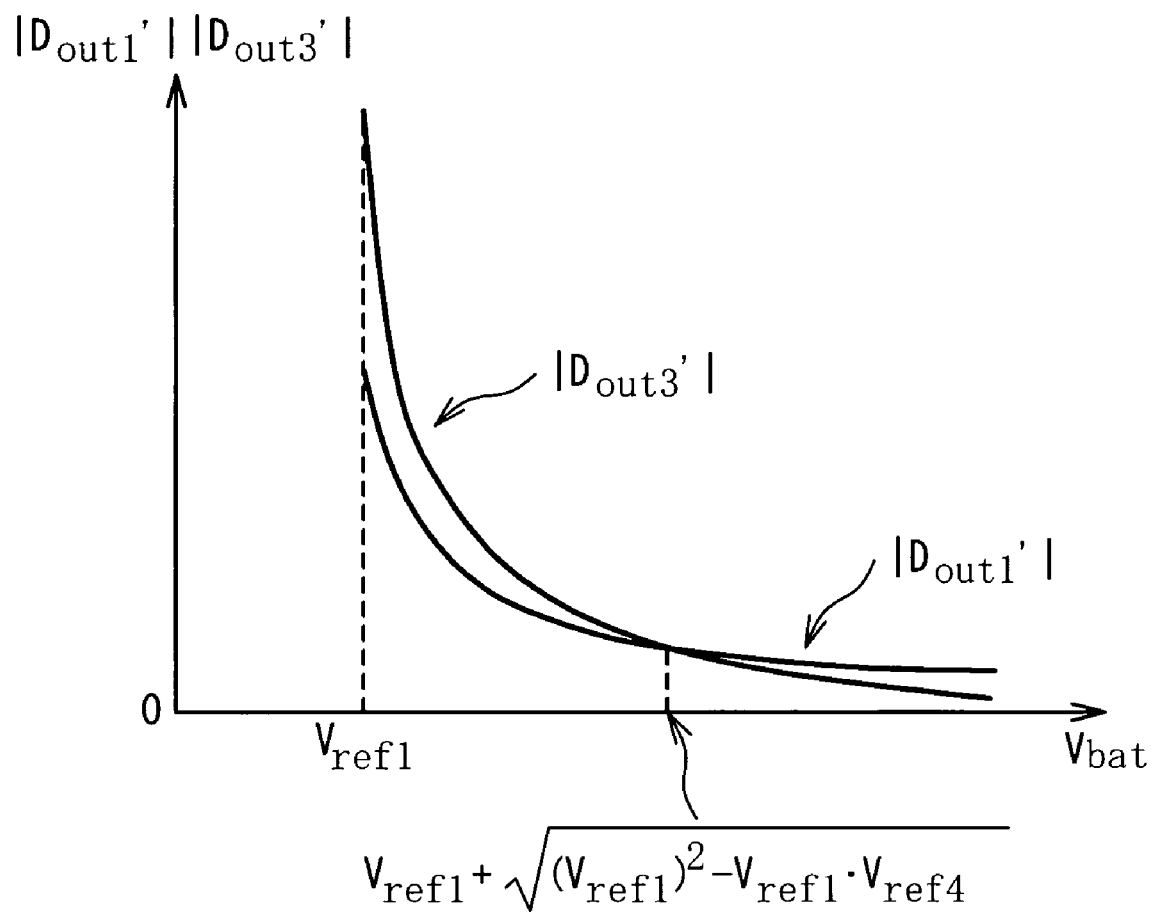
FIG. 8 shows a relationship between the battery voltage $V_{bat}$ and the digital output value $D_{out3}$ in the battery voltage measuring system 10 according to the present invention for a relationship between the battery voltage $V_{bat}$ and the digital output value $D_{out1}$ in the battery voltage detecting circuit 110 according to the first conventional example.

Therefore, the equations (4) and (5) are graphically illustrated in FIG. 8. More specifically, FIG. 8 shows a relationship of the battery voltage $V_{bat}$ and the digital output value $D_{out3}$ in the battery voltage measuring system 10 according to the present invention for a relationship between the battery voltage $V_{bat}$ and the digital output value $D_{out1}$ in the battery voltage detecting circuit 110 according to the first conventional example. As apparent from FIG. 8, when the battery voltage $V_{bat}$ starts to fall below a value shown by the following equation (15), the measurement accuracy in the present invention becomes higher than that in the first conventional example.

$$V_{ref1} + \sqrt{(V_{ref1})^2 - V_{ref1}V_{ref4}} \quad (15)$$

As described above, the battery voltage measuring system 10 according to the present invention can measure the battery voltage near the discharge end voltage with higher accuracy than the battery voltage detecting circuit 110 according to the first conventional example.

The equation (14) and FIG. 8 will be described using a specific example. Here, a case where a lithium ion battery having a discharge characteristic as shown in FIG. 9 is used will be considered.

Figure 9:
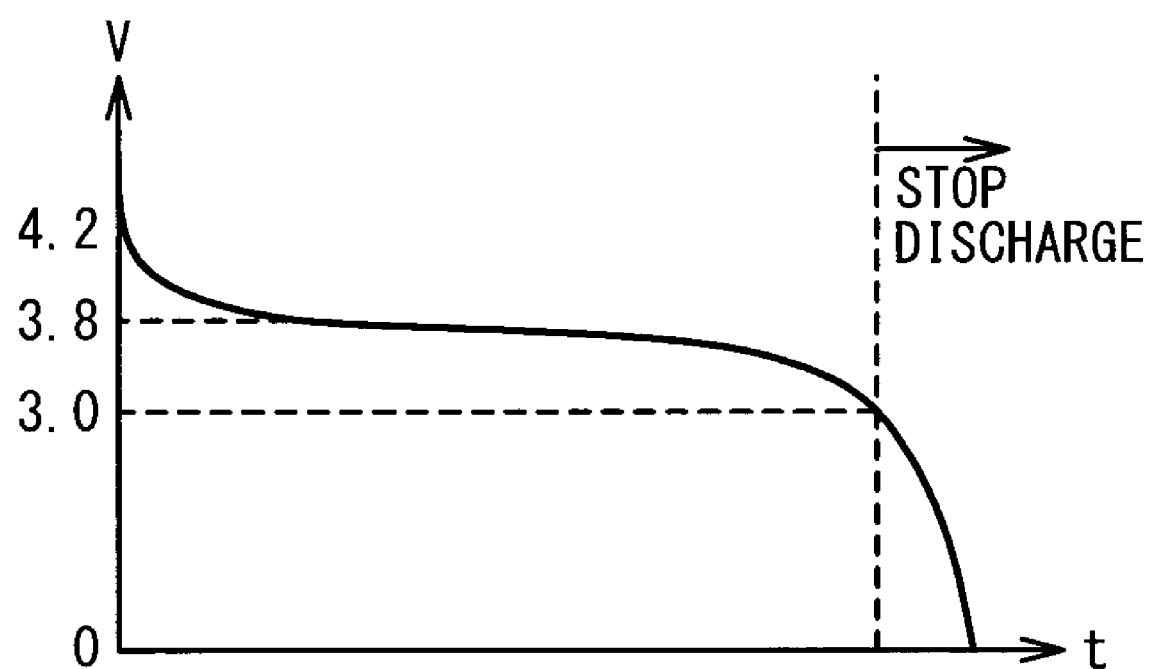
FIG. 9 shows a relationship (discharge characteristics) between time during when a lithium ion battery is used and voltage (battery voltage)
Figure 10A:
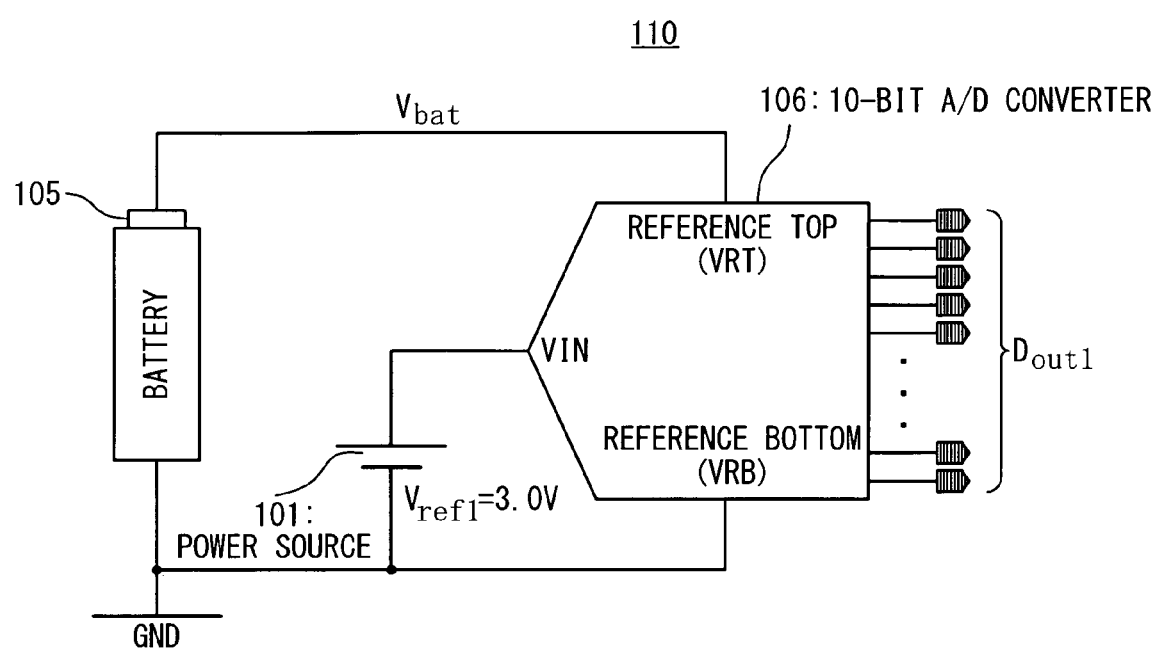
FIG. 10A shows a specific example of the battery voltage detecting circuit 110 according to the first conventional example.
Figure 10B:
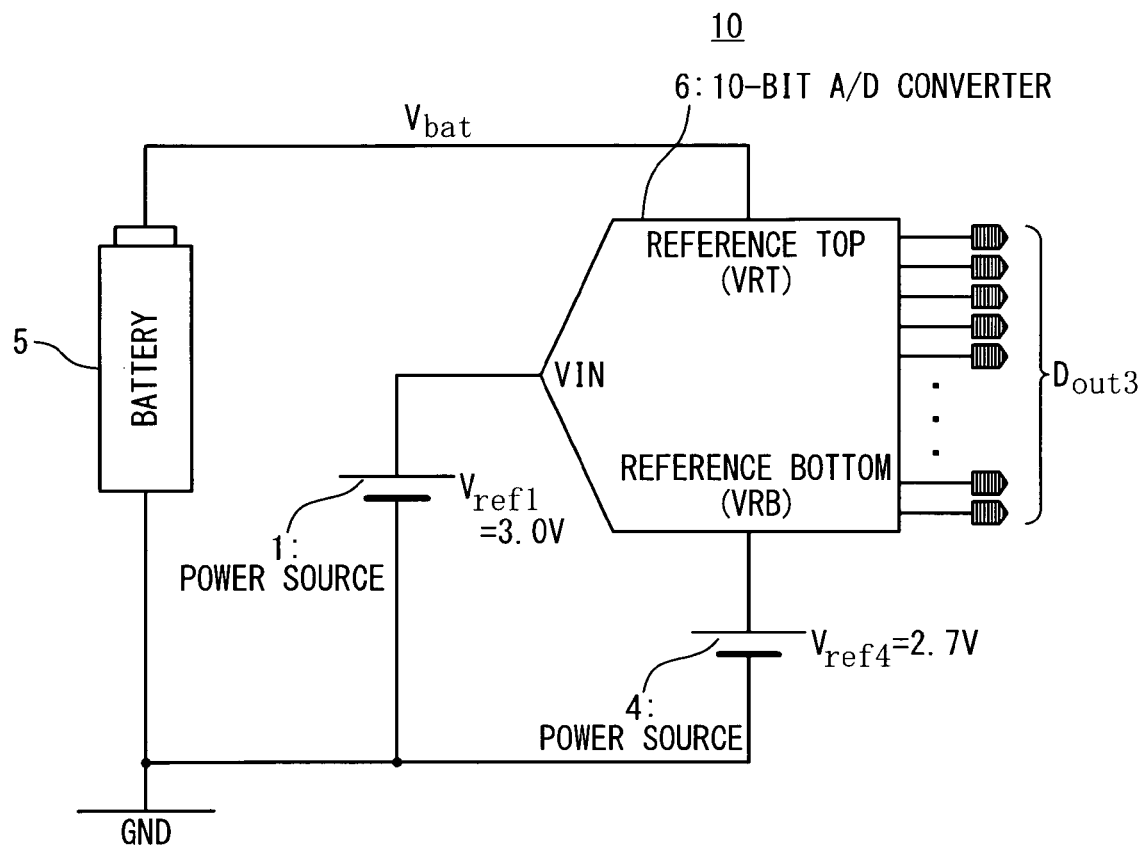
FIG. 10B shows a specific example of the battery voltage measuring system 10 according to the present invention.

FIG. 9 shows a relationship (discharge characteristic) between time during which the lithium ion battery is used and voltage thereof (battery voltage). When the lithium ion battery is used, the discharge end voltage is generally set to 3.0[V] in a mobile phone and 2.5[V] in digital cameras, and voltages near the discharge end voltage need to be measured with high sensitivity. In this example, an expected discharge end voltage of the battery 5 (lithium ion battery) is defined as 3.0[V]. In this case, according to the first conventional example and the present invention, as shown in FIGS. 10A and 10B, respectively, the reference voltage $V_{ref1}$ is set to 3.0[V]. According to the present invention, as shown in FIG. 10B, the reference voltage $V_{ref4}$ is set to 2.7[V] near the discharge end voltage. For the lithium ion battery, the equations (4) and (5) are graphically indicated in FIG. 11.

Figure 11:
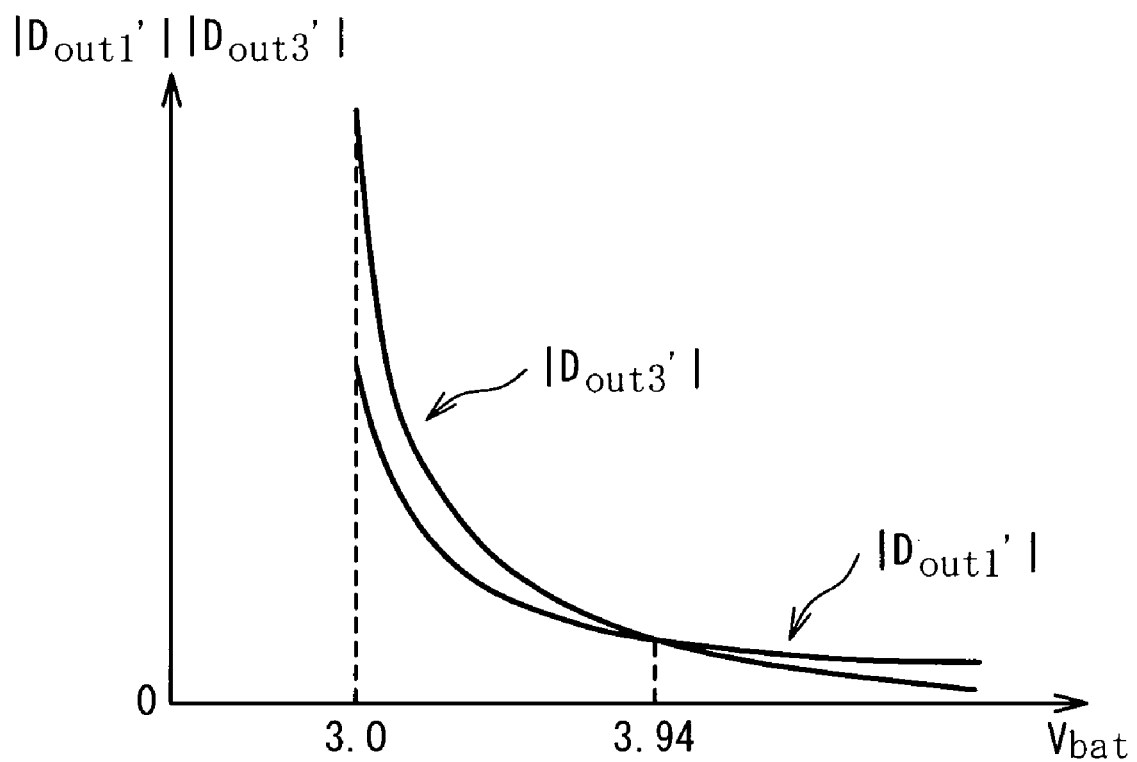
FIG. 11 shows a relationship between the battery voltage $V_{bat}$ and the digital output value $D_{out3}$ in the battery voltage measuring system 10 according to the present invention for a relationship between the battery voltage $V_{bat}$ and the digital output value $D_{out1}$ in the battery voltage detecting circuit 110 according to the first conventional example.

FIG. 11 shows a relationship between the battery voltage $V_{bat}$ and the digital output value $D_{out3}$ in the battery voltage measuring system 10 according to the present invention for a relationship between the battery voltage $V_{bat}$ and the digital output value $D_{out1}$ in the battery voltage detecting circuit 110 according to the first conventional example. As shown in FIG. 11, when the battery voltage $V_{bat}$ starts to fall below 3.94[V], measurement accuracy in the present invention becomes higher than that in the first conventional example.

Next, in order to compare measurement accuracy in the second conventional example with that in the present invention, the equations (2) and (3) are differentiated, like the first conventional example. Absolute values when the equations (2) and (3) are differentiated are represented by the following equation (16) and the above-described equation (5).

$$|(D_{out2})'| = \left| -(2^n - 1) \frac{x}{V_{ref2} - V_{ref3}} \right| \quad (16)$$

$$= (2^n - 1) \frac{x}{V_{ref2} - V_{ref3}}$$

To compare the equation (16) with the equation (5), subtraction of the equation (16) from the equation (5) is represented by the following equation (17).

$$|(D_{out3})'| - |(D_{out2})'| = \quad (17)$$

$$(2^n - 1) \frac{V_{ref1} - V_{ref4}}{(V_{bat} - V_{ref4})^2} - (2^n - 1) \frac{x}{V_{ref2} - V_{ref3}} =$$

$$(2^n - 1) \left\{ \frac{V_{ref1} - V_{ref4}}{(V_{bat} - V_{ref4})^2} - \frac{x}{V_{ref2} - V_{ref3}} \right\}$$

When a condition shown in the following equation (18) is applied, the equation (17) is expanded to the following equations (19) to (22).

$$(2^n - 1) \left\{ \frac{V_{ref1} - V_{ref4}}{(V_{bat} - V_{ref4})^2} - \frac{x}{V_{ref2} - V_{ref3}} \right\} \geq 0 \quad (18)$$

$$\frac{V_{ref1} - V_{ref4}}{(V_{bat} - V_{ref4})^2} \geq \frac{x}{V_{ref2} - V_{ref3}} \quad (19)$$

$$\frac{(V_{ref1} - V_{ref4}) \times (V_{ref2} - V_{ref3})}{x} \geq (V_{bat} - V_{ref4})^2 \quad (20)$$

$$-\sqrt{\frac{(V_{ref1} - V_{ref4})(V_{ref2} - V_{ref3})}{x}} \leq \quad (21)$$

$$(V_{bat} - V_{ref4}) \leq \sqrt{\frac{(V_{ref1} - V_{ref4})(V_{ref2} - V_{ref3})}{x}}$$

$$V_{ref4} - \sqrt{\frac{(V_{ref1} - V_{ref4})(V_{ref2} - V_{ref3})}{x}} \leq \quad (22)$$

$$V_{bat} \leq V_{ref4} + \sqrt{\frac{(V_{ref1} - V_{ref4})(V_{ref2} - V_{ref3})}{x}}$$

However, because of $V_{bat} \geq V_{ref1b} \geq V_{ref4}$, the equation (22) is represented by the following equation (23).

$$V_{ref1} \leq V_{bat} \leq V_{ref4} + \sqrt{\frac{(V_{ref1} - V_{ref4})(V_{ref2} - V_{ref3})}{x}} \quad (23)$$

Figure 12:
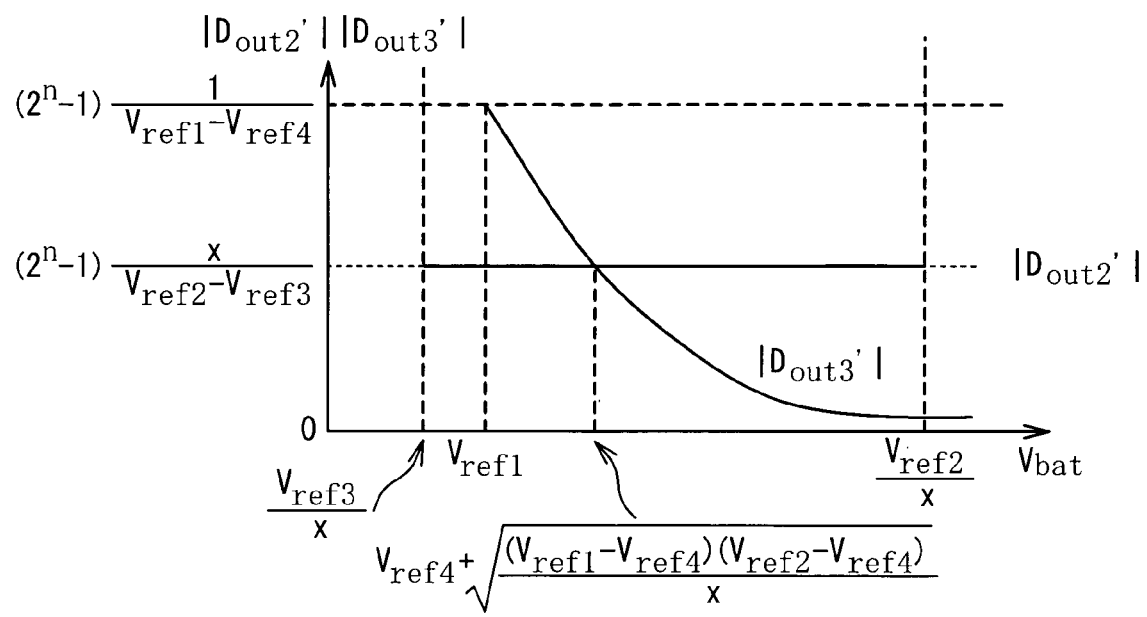
FIG. 12 shows a relationship between the battery voltage $V_{bat}$ and the digital output value $D_{out3}$ in the battery voltage measuring system 10 according to the present invention for a relationship between the battery voltage $V_{bat}$ and the digital output value $D_{out2}$ in the battery voltage measuring system 120 according to the second conventional example.

As described above, the equations (16) and (5) are graphically illustrated in FIG. 12. FIG. 12 shows a relationship between the battery voltage $V_{bat}$ and the digital output value $D_{out3}$ in the battery voltage measuring system 10 according to the present invention for a relationship between the battery voltage $V_{bat}$ and the digital output value $D_{out2}$ in the battery voltage measuring system 120 according to the second conventional example. As shown in FIG. 12, when the battery voltage $V_{bat}$ starts to fall below a value shown by the following equation (24), the measurement accuracy in the present invention becomes higher than that in the second conventional example.

$$V_{ref4} + \sqrt{\frac{(V_{ref1} - V_{ref4})(V_{ref2} - V_{ref3})}{x}} \quad (24)$$

(Although being $V_{ref3}/x < V_{ref1}$ in FIG. 12, it is not limited to this, depending on values of $V_{ref1}$ and $V_{ref3}$, and x).

As described above, the battery voltage measuring system 10 according to the present invention can measure the battery voltage near the discharge end voltage with higher accuracy than the battery voltage measuring system 120 according to the second conventional example. Furthermore, the battery voltage measuring system 10 according to the present invention is smaller in circuit scale (the circuit for dividing voltage is unnecessary) than the battery voltage measuring system 120 according to the second conventional example. In this case, the battery voltage measuring system 10 can performed measurement near a voltage at which measurement accuracy is to be improved to higher accuracy.

The equation (23) and FIG. 12 will be described using a specific example. Here, the case where the lithium ion battery having a discharge characteristic as shown in FIG. 9 is used will be considered, like the first conventional example.

Figure 13A:
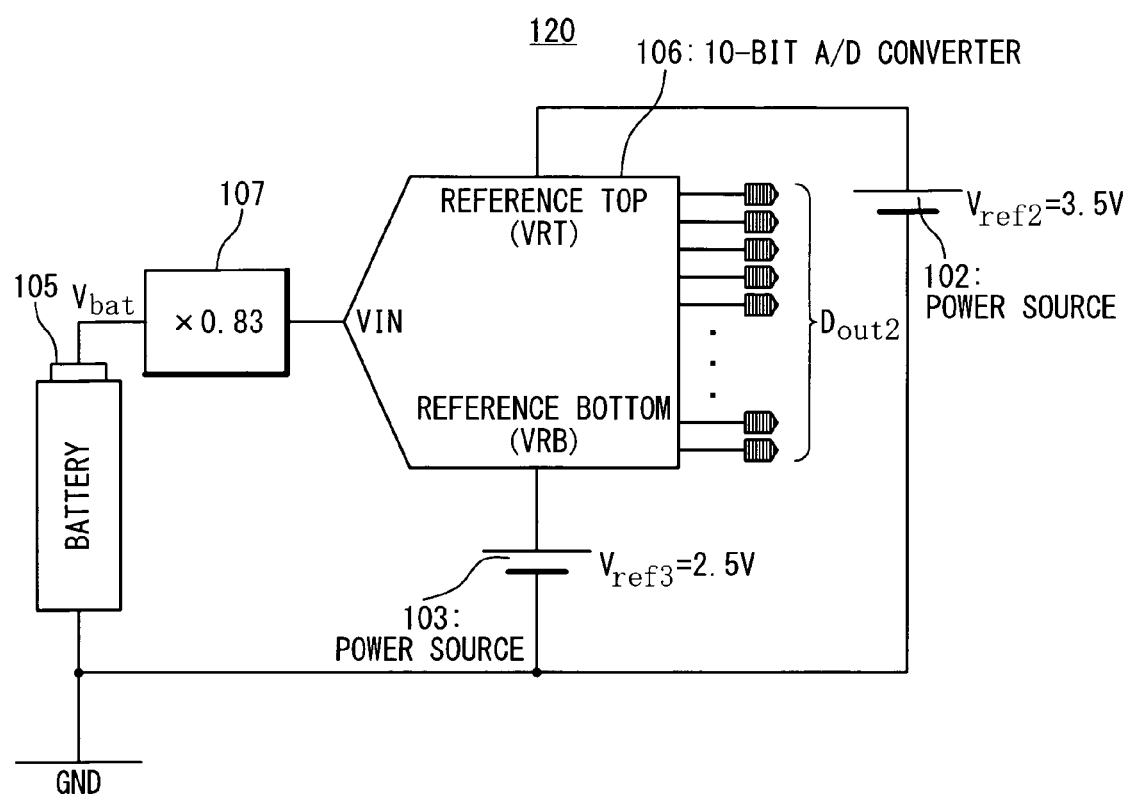
FIG. 13A shows a specific example of the battery voltage measuring system 120 according to the second conventional example.
Figure 13B:
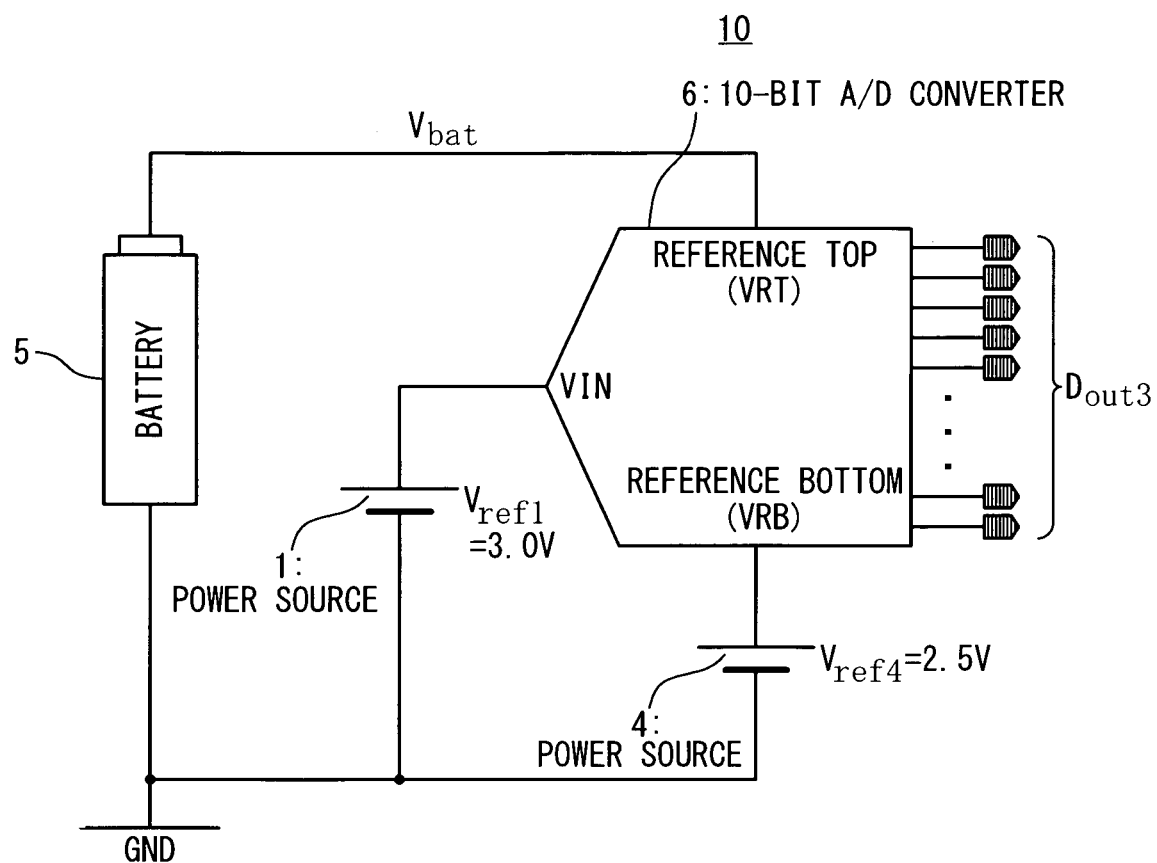
FIG. 13B shows a specific example of the battery voltage measuring system 10 according to the present invention.

As described above, when the lithium ion battery is used, the discharge end voltage is generally set to 3.0[V] in a mobile phone and 2.5[V] in a digital camera. In this example, an expected discharge end voltage of the battery 5 (lithium ion battery) is defined as 3.0[V]. In this example, according to the second conventional example, as shown in FIG. 13A, the reference voltage $V_{ref2}$ and the voltage division ratio x are set to 3.5[V], 0.83, respectively, and the reference voltage $V_{ref3}$ is set to 2.5[V] near the discharge end voltage. According to the present invention, as shown in FIG. 13B, the reference voltage $V_{ref1}$ is set to 3.0[V] and the reference voltage $V_{ref4}$ is set to 2.7[V] near the discharge end voltage. For the lithium ion battery, the equation (16) and the equation (5) are graphically illustrated in FIG. 14.

Figure 14:
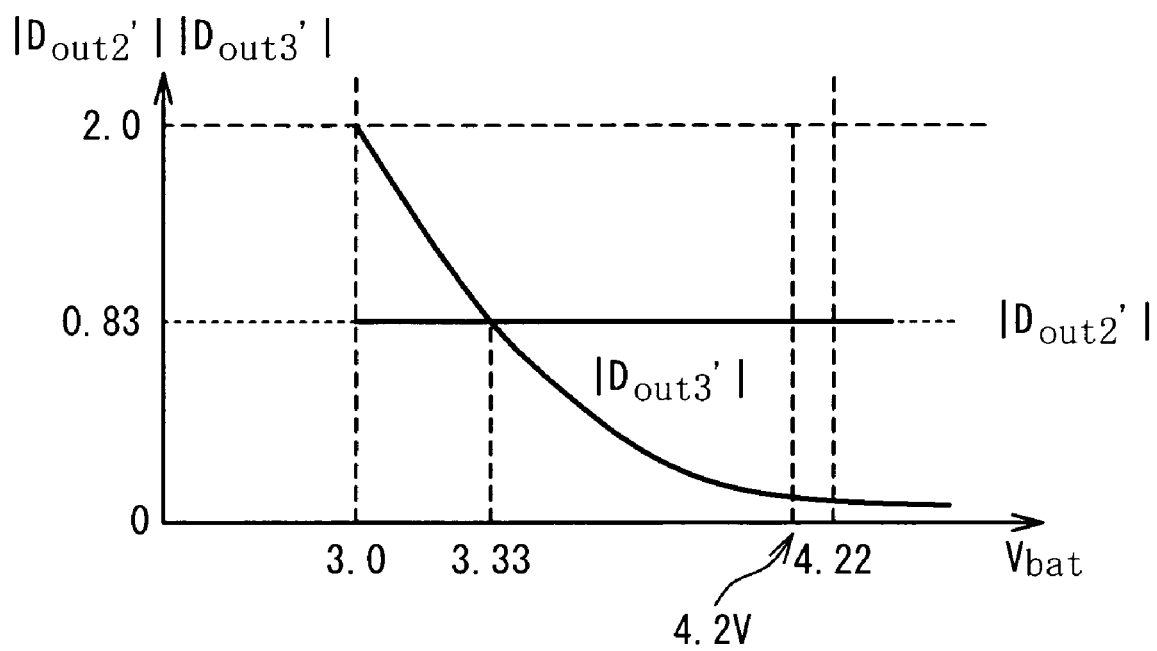
FIG. 14 shows a relationship between the battery voltage $V_{bat}$ and the digital output value $D_{out3}$ in the battery voltage measuring system 10 according to the present invention for a relationship between the battery voltage $V_{bat}$ and the digital output value $D_{out2}$ in the battery voltage measuring system 120 according to the second conventional example.

FIG. 14 shows a relationship between the battery voltage $V_{bat}$ and the digital output value $D_{out3}$ in the battery voltage measuring system 10 according to the present invention for a relationship between the battery voltage $V_{bat}$ and the digital output value $D_{out2}$ in the battery voltage measuring system 120 according to the second conventional example. As shown in FIG. 14, when the battery voltage $V_{bat}$ starts to fall below 3.33[V], the measurement accuracy in the present invention becomes higher than that in second conventional example.

As has been described, the battery voltage measuring system 10 according to the present invention can measure the battery voltage near the discharge end voltage with higher accuracy than the conventional battery voltage measuring systems 110, 120.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A battery voltage measuring system comprising:
   a battery configured to supply a battery voltage as a higher reference voltage;
   a first power supply configured to supply a first reference voltage as an input voltage; and
   a second power supply configured to supply a second reference voltage as a lower reference voltage which is lower than the higher reference voltage; and
   an analog/digital converter configured to receive the higher reference voltage and the lower reference voltage and to output a digital output value based on the input voltage which is lower than the higher reference voltage and is higher than the lower reference voltage.

2. The battery voltage measuring system according to claim 1, further comprising:
   a control circuit having a table indicating a relation between a plurality of voltages and a plurality of digital output values, and configured to refer to said table based on the digital output value outputted from said analog/digital converter to detect one of the plurality of voltages as the battery voltage.

3. The battery voltage measuring system according to claim 1, wherein the lower reference voltage is set to a voltage near an expected discharge end voltage of said battery.

4. The battery voltage measuring system according to claim 1, wherein said battery is installed in a portable equipment.

5. The battery voltage measuring system according to claim 1, wherein the battery voltage measuring system is built in a portable equipment.

6. The battery voltage measuring system according to claim 2, wherein the battery voltage measuring system is built in a portable equipment.

7. A method of measuring a battery voltage, comprising:
   supplying a battery voltage to an analog/digital converter as a higher reference voltage;
   supplying a first reference voltage to said analog/digital converter as an input voltage;
   supply a second reference voltage to said analog/digital converter as a lower reference voltage; and
   converting the input voltage which is lower than the higher reference voltage and is higher than the lower reference voltage into a digital output value by said analog/digital converter.

8. The method according to claim 7, further comprising:
   referring to a table based on the digital output value to detect one of a plurality of voltages as the battery voltage, wherein the table indicating a relation of said plurality of voltage and a plurality of digital output values.

9. The method according to claim 7, further comprising:
   setting the lower reference voltage to a voltage near an expected discharge end voltage of said battery.

10. A voltage monitor circuit comprising:
    first and second terminals between which a voltage to be monitored is supplied; and
    an A/D converter having an input node and first and second reference nodes and performing an A/D converting operation on a voltage supplied to the input node in response to a voltage between the first and second reference nodes, the first reference node being connected to the first terminal, the input node being supplied with a first reference voltage which is generated with respect to the second terminal, and the second reference node being supplied with a second reference voltage which is different from a voltage supplied to the second terminal.

11. The voltage monitor circuit according to claim 10, further comprising:
    a first reference voltage source connected to between the input node and the second terminal to generate the first reference voltage and a second reference voltage source connected between the second reference node and the second terminal.

12. The voltage monitor circuit according to claim 10, wherein the A/D converter further comprises first and second power nodes which are connected respectively to the first and second terminals to operate on the voltage to be monitored.

13. The voltage monitor circuit according to claim 12, wherein the A/D converter produces output data that is relative to a difference in voltage between the input node and the second reference node and a difference in voltage between the first and second reference nodes.

14. The voltage monitor circuit according to claim 11, wherein the voltage to be monitored is generated by a battery.

15. The voltage monitor circuit according to claim 14, wherein the battery is rechargeable.

16. The voltage monitor circuit according to claim 11, wherein the A/D converter and the first and second reference voltage sources are built in an integrated circuit device.

17. The battery voltage measuring system according to claim 1, wherein the first reference voltage is set to the discharge end voltage.

18. The method according to claim 7, wherein the first reference voltage is set to the discharge end voltage.

19. The voltage monitor circuit according to claim 10, wherein the first reference voltage is set to the discharge end voltage.

* * * * *